United States Patent [19]

Despain et al.

[11] Patent Number: 5,483,169
[45] Date of Patent: Jan. 9, 1996

[54] RF IMAGING OF LOW OBSERVABLE COATINGS USING A WIRE-OVER-GROUND-PLANE TRANSMISSION LINE

[75] Inventors: Ronald R. Despain, Temecula, Calif.; Don J. Dougherty, Ames, Iowa; Jack Nachamkin, Poway, Calif.; Robert Schappelle, San Diego, Calif.; Jon M. Stinson, San Diego, Calif.; Vanessa M. Weslow, Escondido, Calif.

[73] Assignee: McDonnell Douglas Corporation, Huntington Beach, Calif.

[21] Appl. No.: 100,464

[22] Filed: Jul. 30, 1994

[51] Int. Cl.⁶ .................................................. G01R 31/11
[52] U.S. Cl. ........................ 324/534; 324/533; 324/642
[58] Field of Search ..................................... 324/520, 527, 324/528, 532, 533, 534, 535, 539, 632, 639, 642, 644, 67

[56] References Cited

U.S. PATENT DOCUMENTS 3,970,927  7/1976  Ladbrook et al. ................... 324/67
4,471,294  9/1984  Nielsen ................................ 324/534
4,634,963  1/1987  Lunden .......................... 324/534 X
4,970,467  11/1990  Burnett ............................. 324/534
5,185,579  2/1993  Mertens et al. ............... 324/533 X

*Primary Examiner*—Kenneth A. Wieder
*Assistant Examiner*—Diep Do
*Attorney, Agent, or Firm*—George W. Finch; Roger C. Turner

[57] ABSTRACT

A non-destructive test system that displays time domain amplitude returns from multi-frequency, multi-phase, constant magnitude RF signals, that are reflected by differences in characteristic impedance of a wire over ground plane transmission line. The reflections are used to detect RF discontinuities or faults in conductive areas that form the ground plane which preferably are resolved using a generalized pencil-of-points algorithm. The nondestructive testing system so constructed is especially useful in testing field repairs of radar absorbing material (RAM) and other features of a conductive object or vehicle whose radar return is to be minimized.

21 Claims, 8 Drawing Sheets

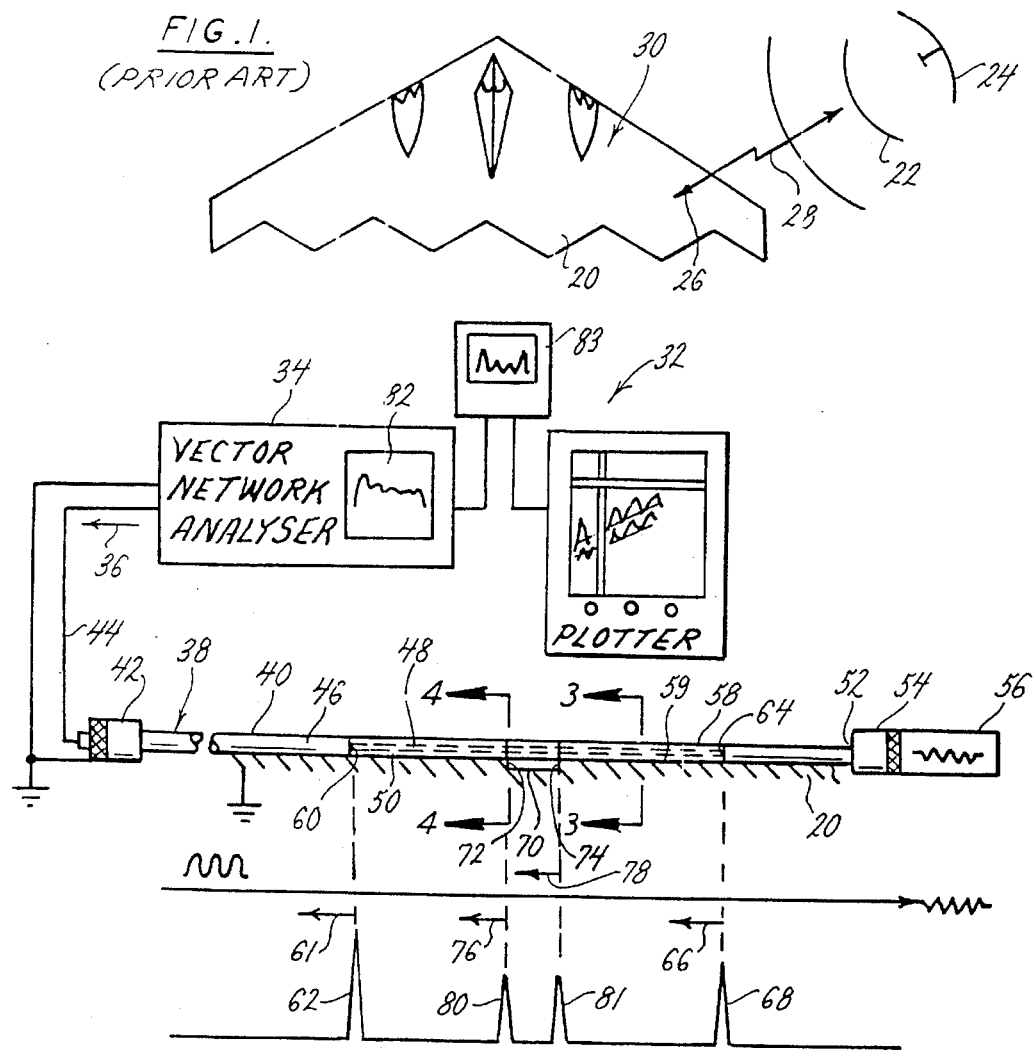
FIG. 1. (PRIOR ART)
FIG. 2.
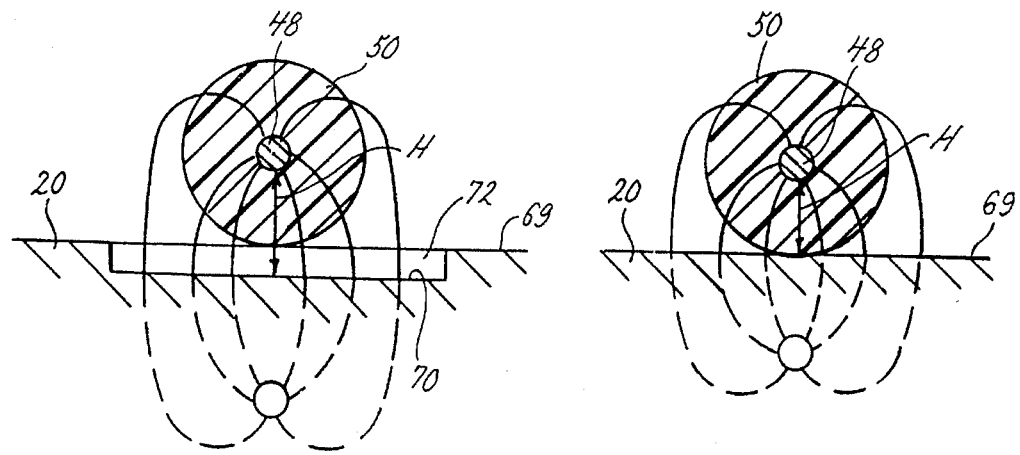
FIG. 4.
FIG. 3.

RF IMAGING OF LOW OBSERVABLE COATINGS USING A WIRE-OVER-GROUND-PLANE TRANSMISSION LINE

BACKGROUND OF THE INVENTION

Low observable aircraft, missiles, ships and other vehicles are carefully constructed to minimize radar reflection. Large surface areas of such vehicles can be successfully treated, yet a small error, such as poor panel fit or an improper repair to a radar-absorbing coating thereon, can result in a radar cross-section of disproportionate magnitude with respect to the physical size of the defect or error. Typical problem areas are mismatched panel joints, discontinuities in radar-absorbing coatings, and other hidden damage that almost inevitably occur in an operational environment. Tests for such defects can be performed at manufacturing sites or radar ranges, but such require a large array of expensive radar test equipment and computers. Such tests are very difficult to perform an operational environment.

There also is a need to provide better, economical and safer means for nondestructive field testing of more conventional conductive structures in critical areas of flight vehicles. Available test systems, such as those that use x-rays are dangerous and difficult to use, whereas acoustic and eddy current test systems produce outputs, which are difficult to interpret or from which faults are difficult to precisely locate.

Therefore, there has been a need to provide a nondestructive testing device and method for both radar cross-section faults and physical defects, which is simple and easy to use, relatively inexpensive, robust, and whose results are easily interpreted.

BRIEF DESCRIPTION OF THE INVENTION

In the present invention, a vector network analyzer, such as the HP 8510B sold by the Hewlett Packard Company of Palo Alto, Calif., or a separate signal generator, is used to produce RF signals which vary in phase and in frequency over a fairly broad frequency range (for example 2 to 18 GHz). This complex signal with shifting frequency and phase, is fed down a probe constructed from a wave guide or other shielded transmission line, such as a coaxial cable positioned on the conductive area to be tested. When a rigid coaxial cable is used to form the probe, the outer conductor or sheath of the coaxial cable is removed at a location along the cable toward its end opposite from the analyzer. At that location, the energy is coupled from the center conductor to the ground plane formed by the conductive area to be tested. The spacing between the center conductor and the conductive area to be tested is maintained by the dielectric normally used to space the center conductor from the sheath. The center conductor and the conductive area are used to form a "wire above ground plane" transmission line for a predetermined distance. The end of the coaxial cable is terminated with its characteristic impedance. If the conductive area (ground plane) has a suitably conductive surface, a termination can be placed directly between the end of the center conductor and the conductive area. However, it is usually more convenient to remove the sheath from an intermediate length of the coaxial cable and then terminate the coaxial cable beyond the missing sheath with a conventional coaxial cable termination.

When RF signals travel down a transmission line, they are partially reflected by every change in characteristic impedance. When a coaxial cable is used for the feed and its center conductor is used for the wire with merely the sheath of the coaxial cable being removed to expose the center conductor to the ground plane, the characteristic impedance of the wire over ground plane is larger, causing a large reflection back toward the analyzer by the transition therebetween, allowing location of the start of the wire over ground plane transmission line. If the ground plane, i.e., the strip of conductive structure underneath the bare center conductor being tested, has consistent spacing from the center conductor and consistent electrical characteristics, there is no further reflection until the wire over ground plane transmission line is transitioned back to coaxial cable for termination or to a termination itself. This second relatively large reflection locates the end of the wire over ground plane transmission line. Spacing discontinuities such as structural cracks or radar reflecting discontinuities in the strip being tested (ground plane) vary the characteristic impedance and cause additional energy to be reflected back toward the analyzer. The analyzer is capable of displaying a fast Fourier transform of the reflected energy. In addition, the reflected energy is processed using a generalized pencil of functions algorithm (GPOF), which produces an enhanced output for display consisting of discrete time domain spikes whose relative positions versus spikes from the two end points of the wire over ground plane transmission line allow location of the defect causing energy reflection. A mathematical description of the GPOF is described in, "Generalized Pencil-of-function Method for Extracting Pales of an EM System from Its Transient Response" by Hua and Sarkar, published in IEEE Transactions on Antennas and Propagation, Vol. 37, No. 2, February 1989.

The magnitudes of such spikes indicate the extent of the discontinuities, i.e., the amounts of instantaneous change in characteristic impedance. When the probe is moved in steps parallel to the conductive area and generally perpendicular to the probe's longitudinal axis, a pseudo 3 dimensional plot of an area of interest can be built up.

The probe portion of the present invention can be constructed from a single piece of coaxial cable with its sheath, but not its dielectric insulation removed so that a wire over ground plane transmission line is created when the probe is laid over a conductive area. The dielectric insulation protects the center conductor from shorting out against the conductive area and maintains a reasonably accurate spacing there above. Multiple frequencies and phases of input signal are used to assure that defects cannot hide just because of a non-fortuitous frequency, phase, RF absorption characteristic and/or positional relationship between the probe and the conductive area and to provide the data needed by the generalized pencil of functions algorithm to resolve the spikes. The analyzer or a separate computer processes the signals returned over the entire frequency band and essentially averages the effect thereof over the frequency band, which typically is 2 to 18 GHz.

The present invention can be used to test for particularly reflective areas on a conductive panel, such as mismatched joints, angled joints, reflective discontinuities, improper RAM coating repair areas and the like. In principle, multiple transmission line probes, constructed according to the present invention, can be permanently mounted underneath a critical structural panel. The transmission lines thereafter are switched to the analyzer during maintenance or when stress is being applied to the structure to sense cracks that develop on the inside, away from the view of inspectors.

Therefore it is an object of the present invention to provide a portable, nondestructive test method for detecting discontinuities that can produce large radar returns.

Another object is to provide a nondestructive test device for RAM coatings and repairs thereto.

Another object is to provide a probe for testing the reflection characteristics of conductive areas which is easily and economically constructed.

Another object is to provide means for detecting discontinuities in conductive panels whose results are easily interpreted as to the position and the magnitude of the discontinuity.

These and other objects and advantages of the present invention become apparent to those skilled in the art after considering the following detailed specification together with the accompanying drawings wherein.

BRIEF DESCRIPTION OF THE DRAWINGS

FIG. 1 is a diagrammatic view of a low observable aircraft with a reflective discontinuity reflecting radar energy;

FIG. 2 is a view of the components of the present invention, including a coaxial probe, a vector network analyzer, a computer, and an optional plotter along with signals reflecting on the probe and the resultant time versus magnitude plot produced by the system;

FIG. 3 is an idealized cross-sectional view taken at line 3—3 on FIG. 2 with representative field lines to help explain a theory of operation of the probe of the present invention;

FIG. 4 is a view similar to FIG. 3 taken a line 4—4 in FIG. 2 at the start of a structural discontinuity;

DETAILED DESCRIPTION OF THE SHOWN EMBODIMENTS

Figure 5:
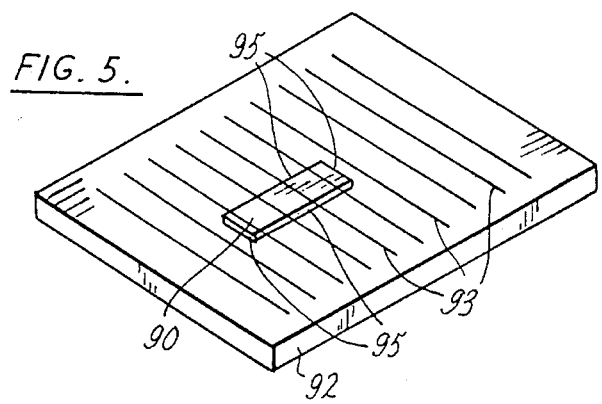
FIG. 5 is a test article having a small conductive shim placed on the surface thereof to create discontinuities.

Referring to the drawings more particular by reference numbers, 20 in FIG. 1 refers to a low observable aircraft being illuminated by RF radiation 22 from a radar 24. The aircraft 20 includes a defect 26 that produces a strong return signal 28 detectable by the radar 24. Defects, such as defect 26 can occur on a low observable vehicle, such as the aircraft 20 through inattention during manufacturer or assembly, or through damage and/or improper repair to the RAM coatings commonly used on such vehicles. Vehicles, such as aircraft 20 can be quite large so small panel joint or RAM defects are not easy to locate. Far field illumination by a radar 24 might indicate that a defect is present but such cannot resolve the location thereof with enough particularity to allow repairs to be made quickly. When there is no visual clue of a defect in a RAM coating, such flaws are very difficult to locate.

The testing system 32 of the present invention, as shown in FIG. 2, provides portable means for determining the location and magnitude of RF reflecting defects 26. The system 32 includes a vector network analyzer 34 that produces RF signals 36 at multiple frequencies and phases to a test probe 38. As shown, the probe 38 includes a piece of coaxial cable 40 that is preferably rigid enough to be self supporting. The cable 40 is connected to the analyzer 34 through a suitable connector 42 and flexible RF transmission means, such as the flexible coaxial cable 44.

The cable 40 has a characteristic impedance $Z_{ch1}$ that is determined from the inside diameter (ID) of its sheath 46, the outside diameter (OD) of its center conductor 48 and the dielectric constant of the insulating spacer 50 that positions the center conductor 48 from the sheath 46 by the formula:

$$Z_{ch1} = \{138/k^{1/2}\} \log ID/OD.$$

The end 52 of the cable 40 opposite the connector 42 includes a second connector 54 that preferably connects to a termination device 56 matching the characteristic impedance $Z_{ch1}$ of the cable 40. A section 58 of the cable 40 has its sheath 46 removed so that the center conductor 48 is exposed. When the probe 38 is laid on a relatively conductive area 59 of the aircraft 20, effectively a wire-over-ground-plane transmission line is created along the section 58. Preferably both the conductive area 59 under test and the sheath 46 are connected to a common ground as shown. However, if no insulative outer coating exists about the sheath 46 and the surface of the area 59 is relatively conductive, the probe 38 may be just positioned on the area 59, relying on contact between the sheath 46 and the area 59 to establish a common potential between the sheath 46 and the area 59.

Wire-over-ground-plane transmission lines have a characteristic impedance related to the height of the wire above the effective electrical ground plane and the dielectric characteristics of matter there between by the formula $Z_{ch2} = \{276/K^{1/2}\} \log H/D$ where H is the height of the wire above the ground plane and D is the diameter of the wire. As shown in FIG. 3, the insulative spacer 50 is used to space and insulate the center conductor 48 from the conductive area 59 (the ground plane). Although the characteristic impedance of such a transmission line is more difficult to calculate than that of a coaxial cable, since it depends upon both the dielectric constant of air and that of the spacer 50, the shape of the spacer 50 and the location of the effective electrical ground plane, which in the case of a RAM coating, might not be co-extensive with its surface, generally such produces a characteristic impedance larger than that of the coaxial cable 40. The abrupt discontinuity in characteristic impedance caused by the transition 60 of the coaxial cable 40 to a wire-over-ground-plane transmission line causes a reflection of RF energy 61 that can be converted to a time domain spike 62 by a properly programmed analyzer 34.

The transition 64 from the sheathless section 58 to the end 52 results in another mismatch of characteristic impedance causing a reflection of energy 66, of slightly less magnitude than the energy 61 that the system 32 uses to display an end spike 68.

As an example, when the analyzer 34 produces frequencies from 2 to 18 GHz, the return can be sampled at four hundred points, equally spaced in frequency. The HP analyzer 34 mentioned above has a built-in fast Fourier transform capability, which transforms the data to the time domain to obtain a range profile of the return. The range profile shows the points of discontinuity in impedance. The representation of these points is done in the best way possible with a Fourier representation, but such is hard to read. Since the points of discontinuity are actually impulses, a more natural mathematical representation is as an expansion of delta functions. This is what is provided by the generalized pencil of functions algorithm. The pencil of functions enables display of a clearly defined spike representative of the exact point of discontinuity. The spikes are located exactly and are not subject to the smearing effects of discrete Fourier transforms, which occur when the location of the discontinuity is not exactly placed with respect to the sampling interval.

As shown in FIGS. 2, 3, and 4, the surface 69 of the area 59 has a physical. discontinuity in the form of a slot 70 having a front edge 72 and a back edge 74. Since the front and back edges 72 and 74 increase and decrease the height H of the center conductor 48 from the effective electrical ground plane, an abrupt change in characteristic impedance thereat causes RF energy 76 and 78 to be reflected, resulting in time domain spikes 80 and 81 respectively on the display 82 of the analyzer 34 or on a separate computer 83. In FIG. 2 the normal fast Fourier Transform is shown being produced by the analyzer 34 and the GPOF is displayed by the computer 83 to show the difference. Since the spikes 62 and 68 correspond to the front and back transmission line transitions 60 and 64, the position of the defect (slot 70) can be easily located from the relative position of the spikes 80 and 81 to the spikes 62 and 68.

Figure 6:
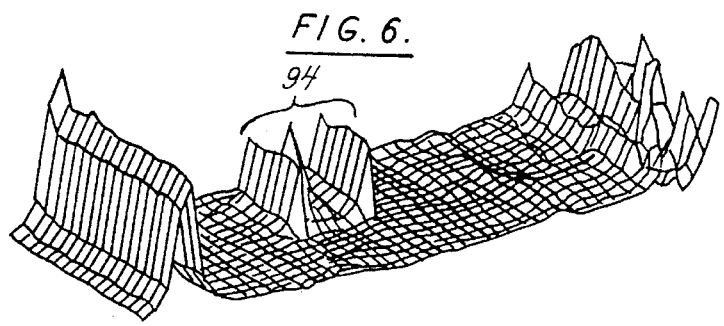
FIG. 6 is a graph of the response of the system of FIG. 2 to the shim at the various locations shown in FIG. 5.

A two-dimensional picture of a defect can be created such as with the scanning method shown in FIGS. 5 and 6. In FIG. 5, a small thin (2.4 mm) shim 90 has been placed on a conductive ground plane 92 to simulate a discontinuity. The section 58 of the probe 38 is moved to the various parallel locations 93 shown while data is collected. The output is then displayed on the 3-dimensional graph shown in FIG. 6 wherein what appears to be a rectangular field of peaks 94 indicates the position of the outer edge 95 of the shim 90.

Figure 7:
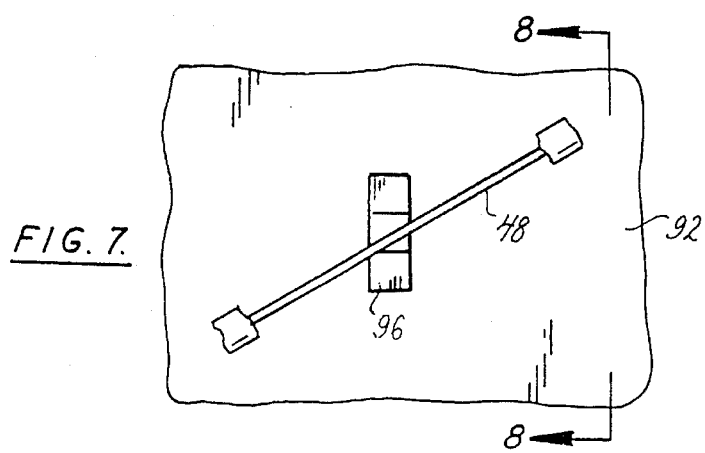
FIG. 7 is a top plan view of a test article having a stepped discontinuity probed by the present invention at 45°.
Figure 8:
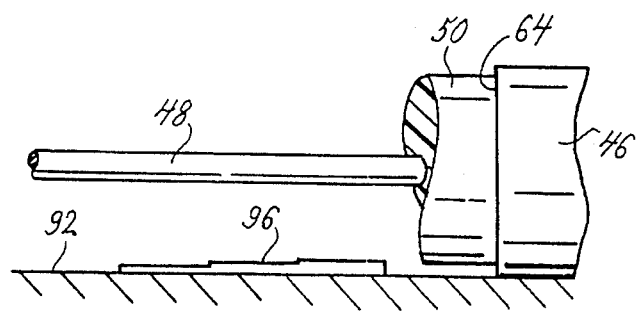
FIG. 8 is an enlarged side view taken at line 8—8 in FIG. 7.
Figure 9A:
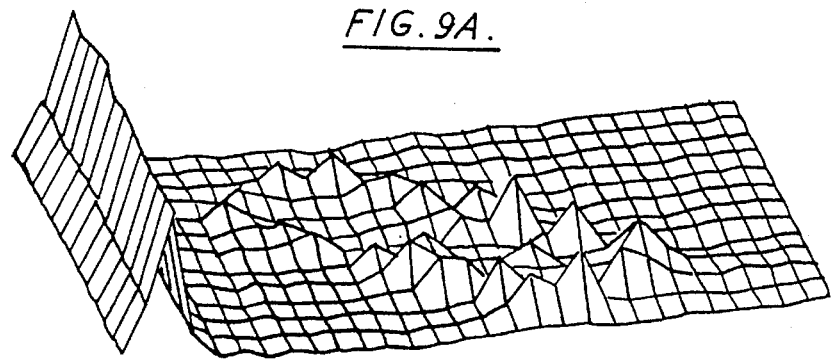
FIGS. 9A and 9B are the graphical results from two 45° scans of the test article of FIGS. 7 and 8.
Figure 9B:
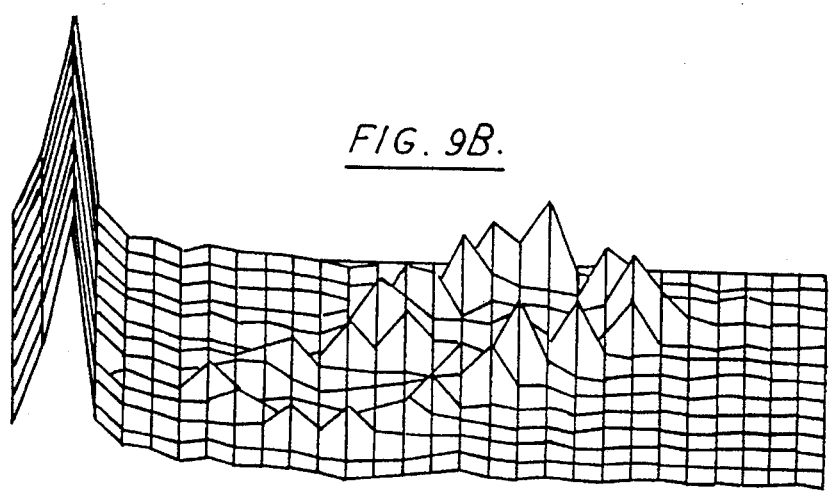

The effect of scanning also can be seen from the results of the scan of a stepped shim 96 placed on the ground plane 92 wherein the probe 38 is scanned across the shim 96 at 45° angles 90° apart, as shown in FIGS. 7 and 8, to produce the apparent 3-dimensional plots shown in FIGS. 9A and 9A, FIG. 9B being the opposite 45° orientation of the probe 38 than that shown in FIG. 7.

Figure 10:
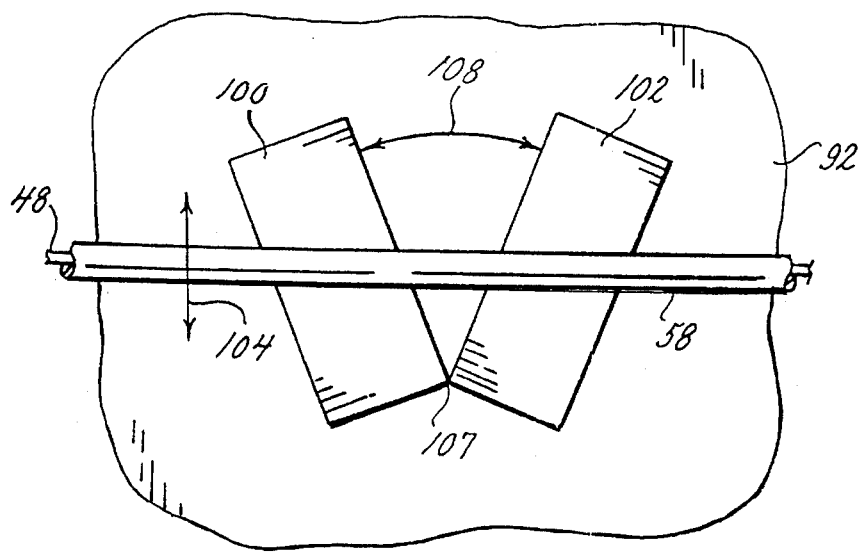
FIG. 10 is a top plan view of a test article to determine the response of the present invention to an angled gap.
Figure 11A:
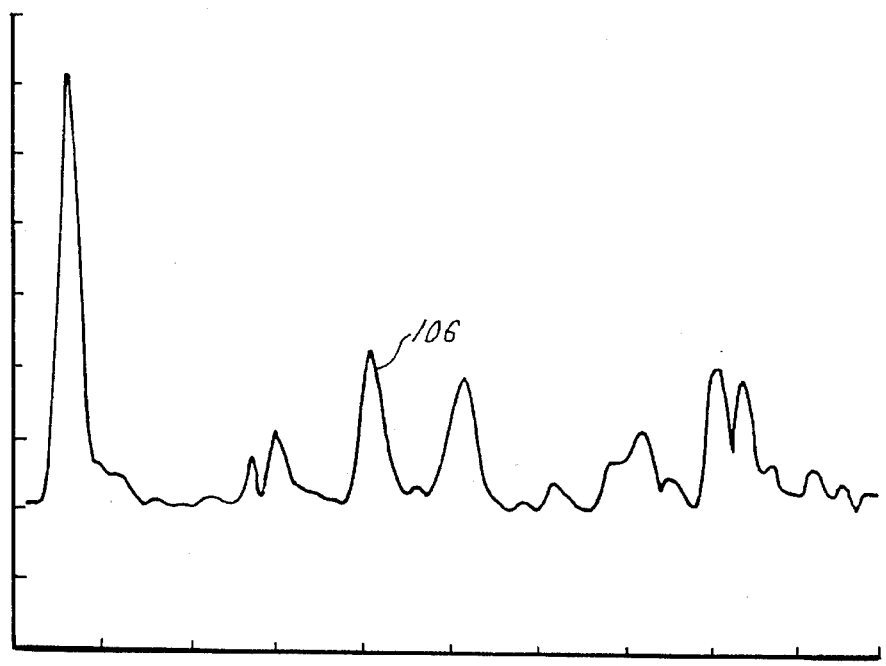
FIGS. 11A, 11B, 11C, 11D, 11E and 11F show how the magnitude of the reflection of the angled gap discontinuity of FIG. 10 decreases as the probe of the present invention is moved toward the notch of the angled gap.
Figure 11B:
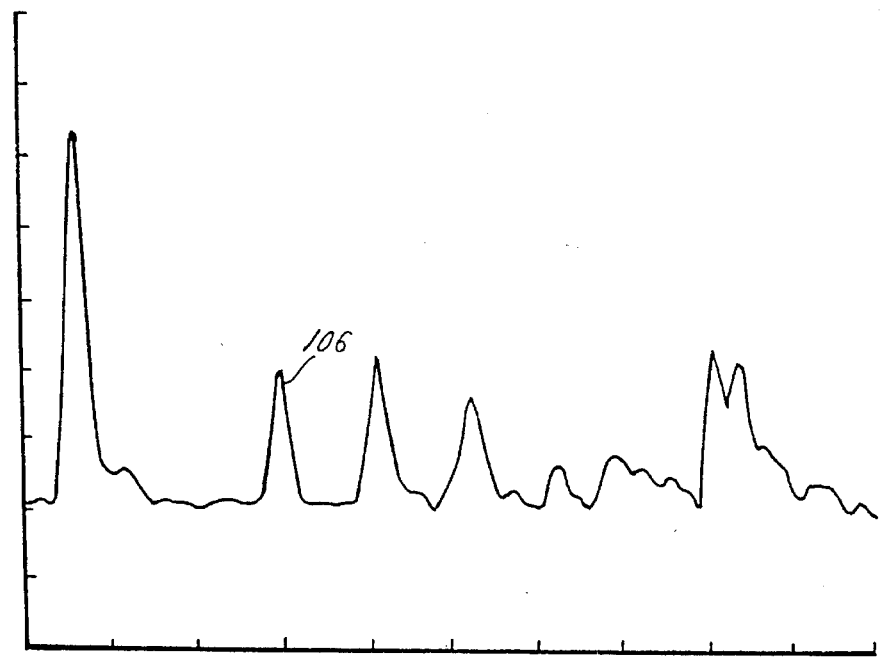
Figure 11C:
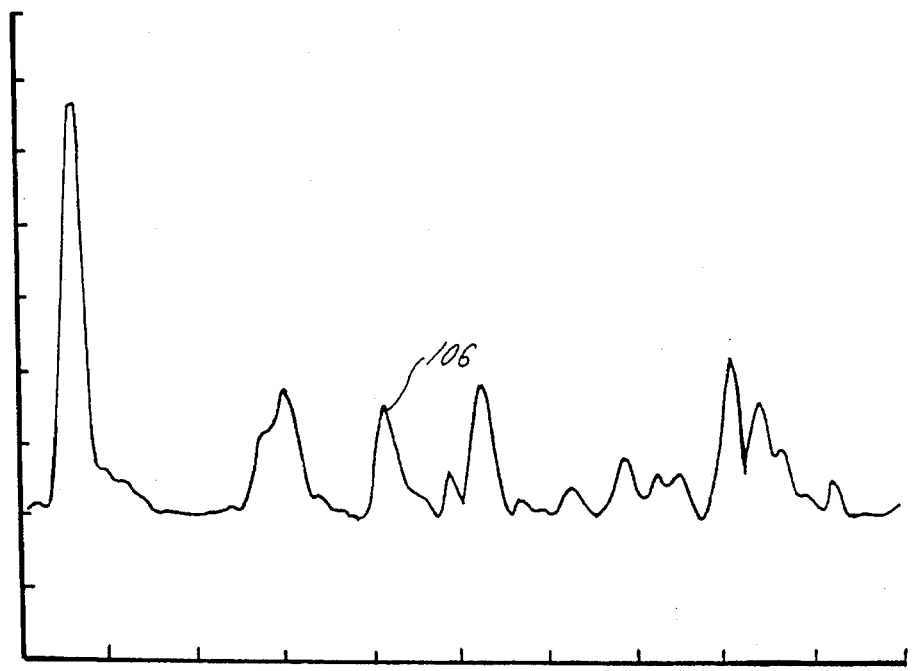
Figure 11D:
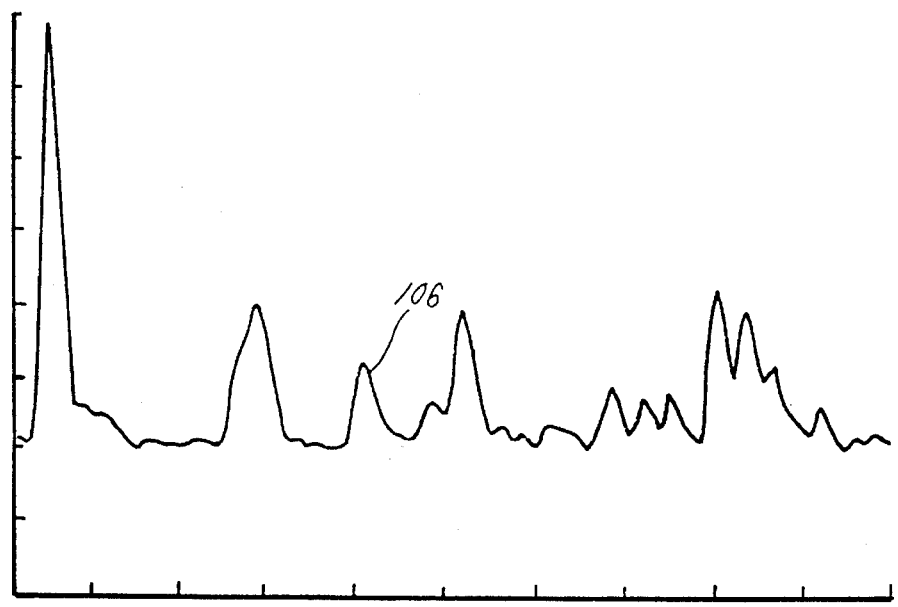
Figure 11E:
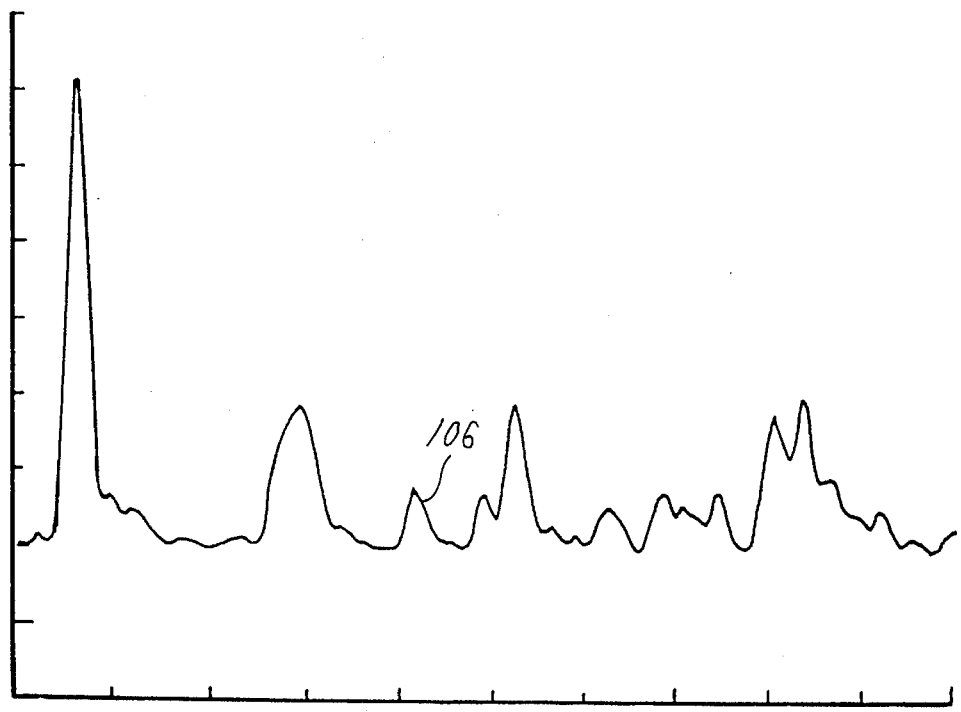
Figure 11F:
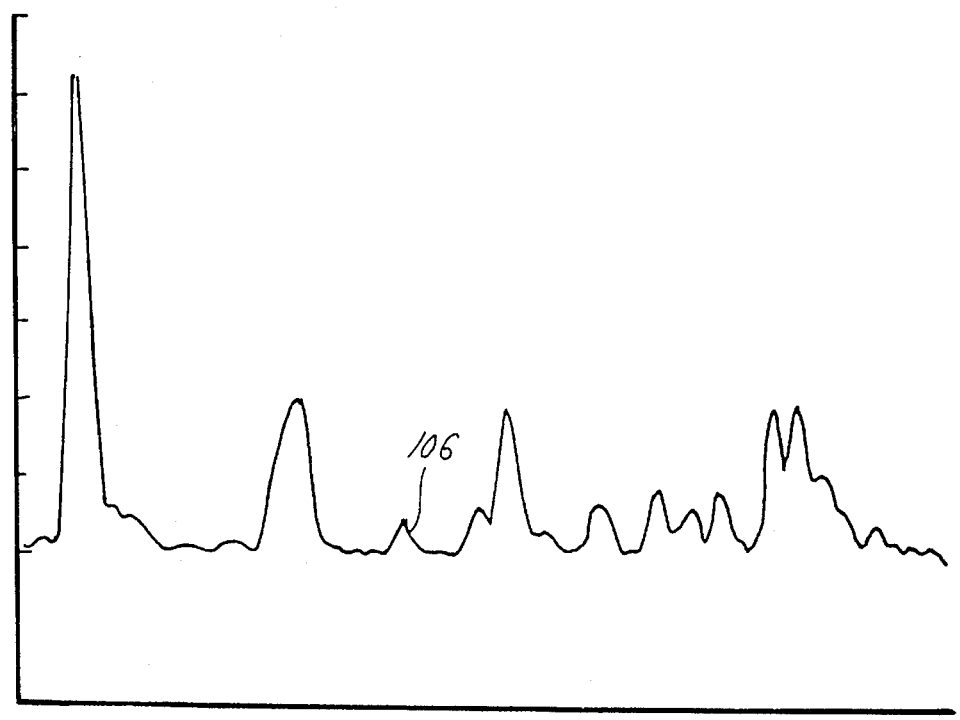

In FIG. 10, a pair of shims 100 and 102 have been placed at 45° to each other on the ground plane 92 and the probe 38 is scanned in the directions of arrow 104. The output of the system 32 is shown in the graphs of FIGS. 11A through 11F, showing the spike 106 that decreases as the probe 38 is moved toward the tip 107 of the 45° notch 108 between the shims 100 and 102, where the notch 108 (discontinuity) is reduced to zero.

Figure 12:
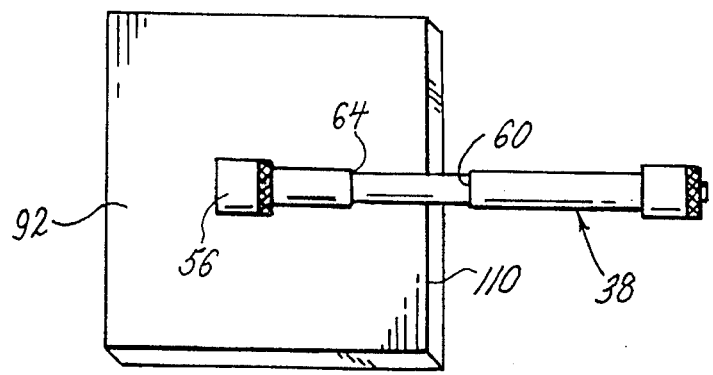
FIG. 12 shows the probe of the present invention being used over the corner of a conductive panel.
Figure 13:
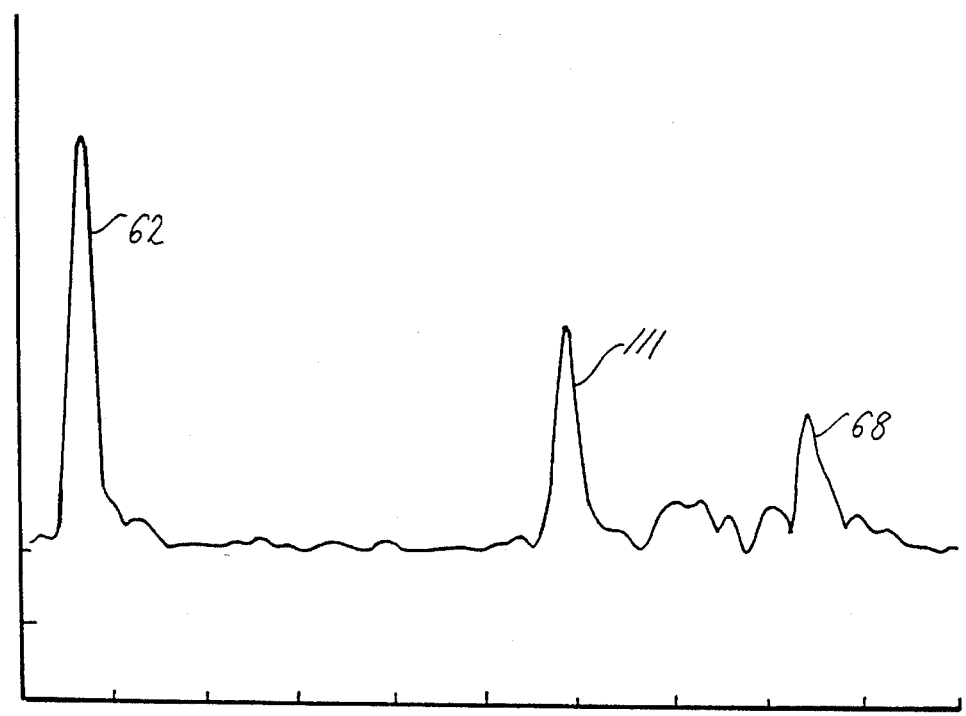
FIG. 13 is a graph of the results produced by the present invention showing the large discontinuity at the panel edge of FIG. 12.
Figure 14:
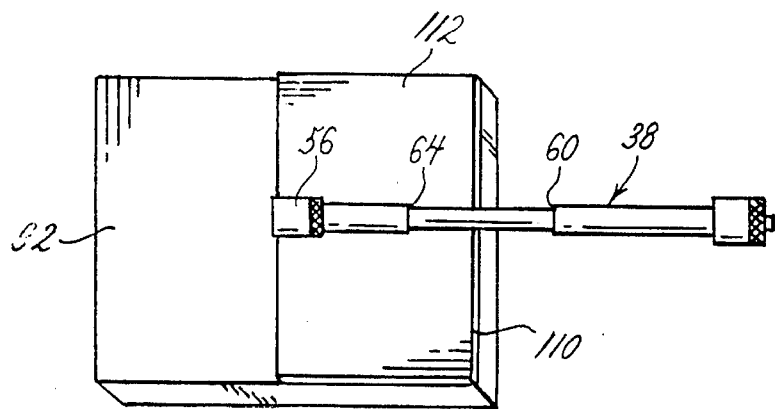
FIG. 14 is a top view of a test substantially similar to that of FIG. 12 except that the edge of the panel includes an R-Card (a structure having distributed resistance to match the impedance of free space gradually) at the edge thereof.
Figure 15:
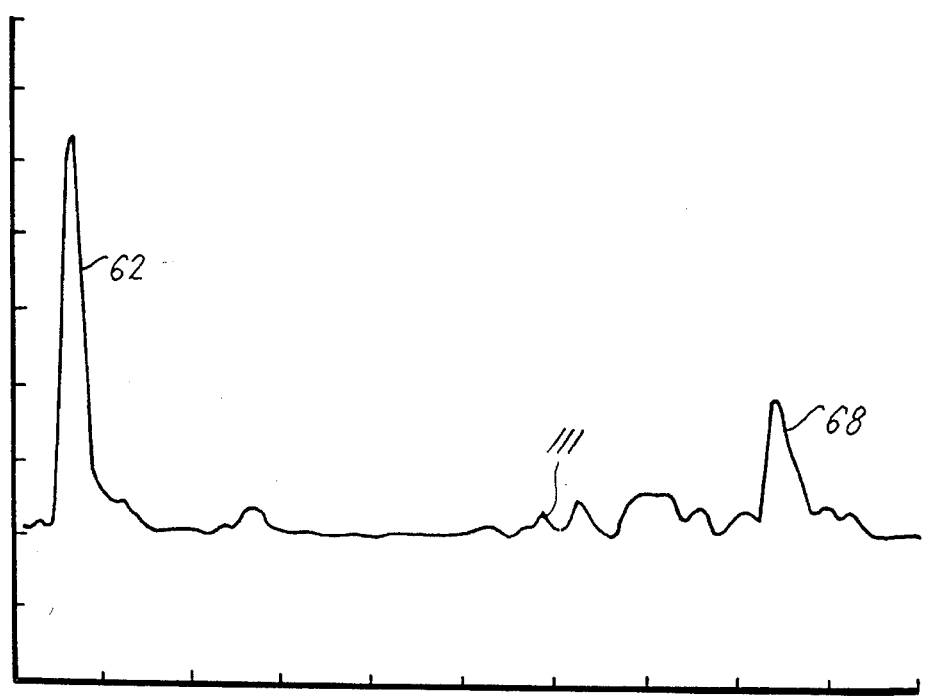
FIG. 15 is a graph of the results produced by the present invention showing the effectiveness of the R-Card in reducing the abrupt change in characteristic impedance normally present at the edge of a conductive panel.

FIG. 12 illustrates the probe 38 being used to sense the edge 110 of the ground plane 92. The effect of the edge 110 is clearly shown by spike 111 in the graph of FIG. 13 with respect to the transitions 60 and 64. When the edge 110 of the ground plane 92 is treated with an R-card 112, normally used in low observable applications to reduce or eliminate reflections from edges, the probe 38 can be used to sense the effectiveness of the R-card 112. As shown in FIG. 15, the R-card 115 eliminates most of the reflection from the edge 110.

Thus, there has been shown a novel system and method for determining defects in conductive surfaces, especially those that produce unwanted radar returns, which fulfill all of the objects and advantages sought therefor. Many changes, alterations, modifications and other uses and applications of the subject system and method will become apparent to those skilled in the art after considering this specification together with the accompanying drawings. All such changes, alterations, modifications and other uses and applications of the subject invention that do not depart from the spirit and scope of the invention, are deemed to be covered by the invention, which is limited only by the claims which follow.

We claim:

1. A testing device for defects in a relatively conductive structure that affect RF energy impinging thereon including:
   a RF probe having:
   an input portion with a predetermined characteristic impedance;
   a conductor extending from said input portion including:
   means to insulatively space said conductor from the relatively conductive structure that is to be tested for defects, wherein a wire-over-ground-plane transmission line is formed by said conductor and the relatively conductive structure; and
   a termination portion connected to said conductor opposite from said input portion.

2. The testing device as defined in claim 1 wherein said termination portion includes:
   a first sub-portion connected to said conductor that has a characteristic impedance similar to the characteristic impedance of said input portion; and
   a second sub-portion connected to said first sub-portion that includes:
   a termination load having an impedance similar to the characteristic impedance of said first sub-portion, whereby minimal reflection of RF energy is caused by said termination load.

3. The testing device as defined in claim 2 wherein said input portion and said first sub-portion of said termination portion are constructed from coaxial cable having:
   a center conductor;
   an outer conductive sheath;
   means to ground said outer conductive sheath to the relatively conductive structure; and
   insulative spacer means between said center conductor and said outer conductive sheath, wherein said conductor is formed by said center conductor of said coaxial cable, and said means to insulatively space said conductor from the relatively conductive structure are said insulative spacer means, said first sub-portion being formed by removal of said outer conductive sheath from said insulative spacer means.

4. The testing device as defined in claim 3 wherein said coaxial cable is relatively rigid, self supporting coaxial cable, and wherein said input portion includes:
   a relatively flexible coaxial cable connected to said relatively rigid, self supporting coaxial cable opposite from said conductor extending from said input portion.

5. The testing device as defined in claim 4 further including:
   vector network analyzer means connected to said relatively flexible coaxial cable opposite said relatively rigid, self supporting coaxial cable for producing RF signals to said RF probe.

6. The testing device as defined in claim 5 wherein said RF signals produced to said RF probe by said vector network analyzer means vary in frequency and phase.

7. The testing device as defined in claim 3 further including:

vector network analyzer means connected to said input portion of said RF probe for producing RF signals to said RF probe, wherein said RF signals produced to said RF probe by said vector network analyzer means vary in frequency and phase and wherein said vector network analyzer means receive reflections of said RF signals from said wire-over-ground-plane transmission line, sample the reflections at predetermined frequencies, and perform fast Fourier transformation of the sampled reflections, said vector network analyzer meads including:

computer means that expand delta functions of the sampled reflections for display as time domain signals whose magnitudes indicate the magnitude of variations in characteristic impedance along said wire-over-ground-plane transmission line.

8. The testing device as defined in claim 3 further including:

vector network analyzer means connected to said input portion of said RF probe for producing RF signals to said RF probe, wherein said RF signals produced to said RF probe by said vector network analyzer means vary in frequency and phase and wherein said vector network analyzer means receive reflections of said RF signals from said wire-over-ground-plane transmission line and display said reflections as time domain signals, each of whose magnitude indicates variation in characteristic impedance along said wire-over-ground-plane transmission line, and whose spacing indicates the positions thereon along the relatively conductive structure.

9. The testing device as defined in claim 8 wherein said vector network analyzer means include:

combining display means so that when said probe is moved parallel to the relatively conductive structure and reflections of RF signals are received by said vector network analyzer means from multiple parallel locations, said combining display means combine the time domain signals to produce a pseudo 3D image of changes in characteristic impedance for the area over which said wire-over-ground-plane transmission line is moved.

10. A low observable testing system including:

a relatively conductive structure having:
at least one defect therein that affects the reflection of RF energy impinging thereon;

a RF probe positioned on said relatively conductive structure having:
an input shielded transmission line portion with a predetermined characteristic impedance;
a conductor extending from said input portion including:
means to insulatively space said conductor from said relatively conductive structure, wherein a wire-over-ground-plane transmission line is formed by said conductor and said relatively conductive structure; and
a termination portion connected to said conductor opposite from said input shielded transmission line portion.

11. The low observable testing system as defined in claim 10 including:

signal generator means connected to said input shielded transmission line portion of said RF probe for producing RF signals thereto that vary in frequency and phase.

12. The low observable testing system as defined in claim 11 further including:

signal processor means connected to said input shielded transmission line portion of said RF probe that:
receive reflections of the RF signals from said wire-over-ground-plane transmission line;
process the reflections of the RF signals; and
display the reflections as time domain signals whose magnitudes indicate amount of variation in characteristic impedances along said wire-over-ground-plane transmission line and whose positions indicate the positions of the reflections along said wire-over-ground-plane.

13. The low observable testing system as defined in claim 12 wherein said signal processor means include:

combining display means so that when said RF probe is moved laterally and parallel to said relatively conductive structure, said combining display means produce a pseudo 3D image of changes in characteristic impedance by displaying multiple time domain signals at the same time and hence indicating the location of said at least one defect.

14. The low observable testing system as defined in claim 11 wherein said signal processor means:

receive reflections of said RF signals of said wire-ground-plane transmission line;
sample the reflections at predetermined frequencies;
perform fast Fourier transformation of the sampled reflections; and
expand delta functions thereof to display the reflections as time domain signals whose magnitudes indicate amount of variation in characteristic impedances along said wire-over-ground-plane transmission line and whose positions indicate the positions of the reflections along said wire-over-ground-plane transmission line.

15. The low observable testing system as defined in claim 14 wherein said termination portion includes:

a sub-portion connected to said conductor that has a characteristic impedance similar to the characteristic impedance of said input shielded transmission line portion; and a termination load having an impedance similar to the characteristic impedance of said first sub-portion connected to said sub-portion.

16. The low observable testing system as defined in claim 15 wherein said input shielded transmission line portion and said sub-portion of said termination portion are constructed from coaxial cable having:

a center conductor;
an outer conductive sheath;
insulative spacer means therebetween; and
means to electrically connect said outer conductive sheath to said relatively conductive structure, wherein said conductor is a portion of said center conductor of said coaxial cable, and said means to insulatively space said conductor from said relatively conductive structure are a portion of said insulative spacer means with said outer sheath removed therefrom.

17. The low observable testing system as defined in claim 16 wherein said coaxial cable is relatively rigid coaxial cable.

18. The low observable testing system as defined in claim 17 wherein said input portion includes:

a relatively flexible coaxial cable connecting said relatively rigid coaxial cable to said signal generator means and said signal processor means.

19. A method of testing for electromagnetic defects in a relatively electrically conductive structure such as those electromagnetic defects that can cause unwanted radar reflections, including the steps of:

placing at least one conductor in spaced insulative relationship with respect to the relatively electrically conductive structure so that a wire-over-ground-plane type transmission line having opposite ends is formed by the conductor and the relatively electrically conductive structure;

transmitting RF signals that vary in frequency and phase the wire-over-ground-plane type transmission line;

detecting reflections of the RF signals from the wire-over-ground-plane type transmission line; and processing the detected reflections of the RF signals from the wire-over-ground-plane type transmission line into first and second time domain spikes indicative of the opposite ends of the wire-over-ground-plane type transmission line and any other reflections of the RF signals from the wire-over-ground-plane type transmission line into time domain spikes whose magnitudes are indicative of the magnitude of defects and whose positions in time are indicative of the positions of the electromagnetic defects of the relatively electrically conductive structure with respect to the opposite ends of the wire-over-ground-plane type transmission line.

20. The method of testing for electromagnetic defects in a relatively electrically conductive structure as defined in claim 19 wherein the processing step includes:

receiving reflections of the RF signals from the wire-over-ground-plane type transmission line;

sampling the reflections at predetermined frequencies;

performing fast Fourier transformation of the sampled reflections; and expanding delta functions thereof for display as time domain signals whose magnitudes indicate the magnitude of variations in characteristic impedance along the wire-over-ground-plane type transmission line.

21. The method of testing for electromagnetic defects in a relatively electrically conductive structure as defined in claim 19 further including the steps of:

moving the at least one conductor to different locations on the relatively conductive structure so that reflections of the RF signals from the wire-over-ground-plane type transmission line are detected from different locations; and displaying the time domain spikes in a pseudo 3D display.

* * * * *